United States Patent
Iwasaki et al.

(10) Patent No.: US 11,081,525 B2
(45) Date of Patent: Aug. 3, 2021

(54) STORAGE DEVICE

(71) Applicant: TOSHIBA MEMORY CORPORATION, Tokyo (JP)

(72) Inventors: Takeshi Iwasaki, Kuwana Mie (JP); Katsuyoshi Komatsu, Yokkaichi Mie (JP); Hiroki Kawai, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/553,746

(22) Filed: Aug. 28, 2019

(65) Prior Publication Data

US 2020/0295086 A1 Sep. 17, 2020

(30) Foreign Application Priority Data

Mar. 12, 2019 (JP) .............................. JP2019-045019

(51) Int. Cl.
*H01L 27/24* (2006.01)
*H01L 45/00* (2006.01)

(52) U.S. Cl.
CPC ........ *H01L 27/2481* (2013.01); *H01L 45/141* (2013.01); *H01L 45/145* (2013.01); *H01L 45/149* (2013.01)

(58) Field of Classification Search
CPC ..... H01L 45/145; H01L 45/14; H01L 45/141; H01L 45/149; H01L 45/04; H01L 45/1233; H01L 27/2481; H01L 27/2427
See application file for complete search history.

(56) References Cited

U.S. PATENT DOCUMENTS

| | | |
|---|---|---|
| 9,425,237 B2 | 8/2016 | Jo |
| 10,084,017 B2 | 9/2018 | Ohba |
| 2016/0064661 A1* | 3/2016 | Kawashima ............ H01L 45/08 257/4 |
| 2016/0336378 A1 | 11/2016 | Ohba et al. |
| 2017/0288140 A1* | 10/2017 | Karpov ................ H01L 45/1233 |
| 2018/0114900 A1 | 4/2018 | Kamata |
| 2018/0294408 A1* | 10/2018 | Yasuda ............... H01L 27/2463 |
| 2019/0036022 A1* | 1/2019 | Pirovano .................. H01L 45/06 |
| 2020/0227477 A1* | 7/2020 | Majhi ................. H01L 27/2481 |

FOREIGN PATENT DOCUMENTS

| | | |
|---|---|---|
| JP | 6273184 B2 | 1/2018 |
| TW | 201535373 A | 9/2015 |
| WO | WO-2015/107945 A1 | 7/2015 |

* cited by examiner

*Primary Examiner* — Vongsavanh Sengdara
(74) *Attorney, Agent, or Firm* — Foley & Lardner LLP

(57) ABSTRACT

A storage device includes a first conductor, a second conductor, a variable resistance layer, a first portion, and a second portion. The variable resistance layer connects with the first conductor or the second conductor. The first portion is provided between the first conductor and the second conductor, and has a first threshold voltage value at which the resistance value changes. The second portion is provided between the first conductor and the first portion and/or between the second conductor and the first portion, and has a second threshold voltage value at which the resistance value changes and which is higher than the first threshold voltage value.

22 Claims, 3 Drawing Sheets

STORAGE DEVICE

CROSS-REFERENCE TO RELATED APPLICATION(S)

This application is based upon and claims the benefit of priority from Japanese Patent Application No. 2019-045019, filed Mar. 12, 2019, the entire contents of which are incorporated herein by reference.

FIELD

Embodiments described herein relate generally to a storage device.

BACKGROUND

A so-called cross-point type storage device has been proposed which has memory cells provided at cross-points of two types of interconnects extending in mutually orthogonal directions. Such a cross-point type storage device includes switching elements for selection of memory cells.

Examples of related art include Japanese Patent No. 6273184.

DETAILED DESCRIPTION

Figure 1:
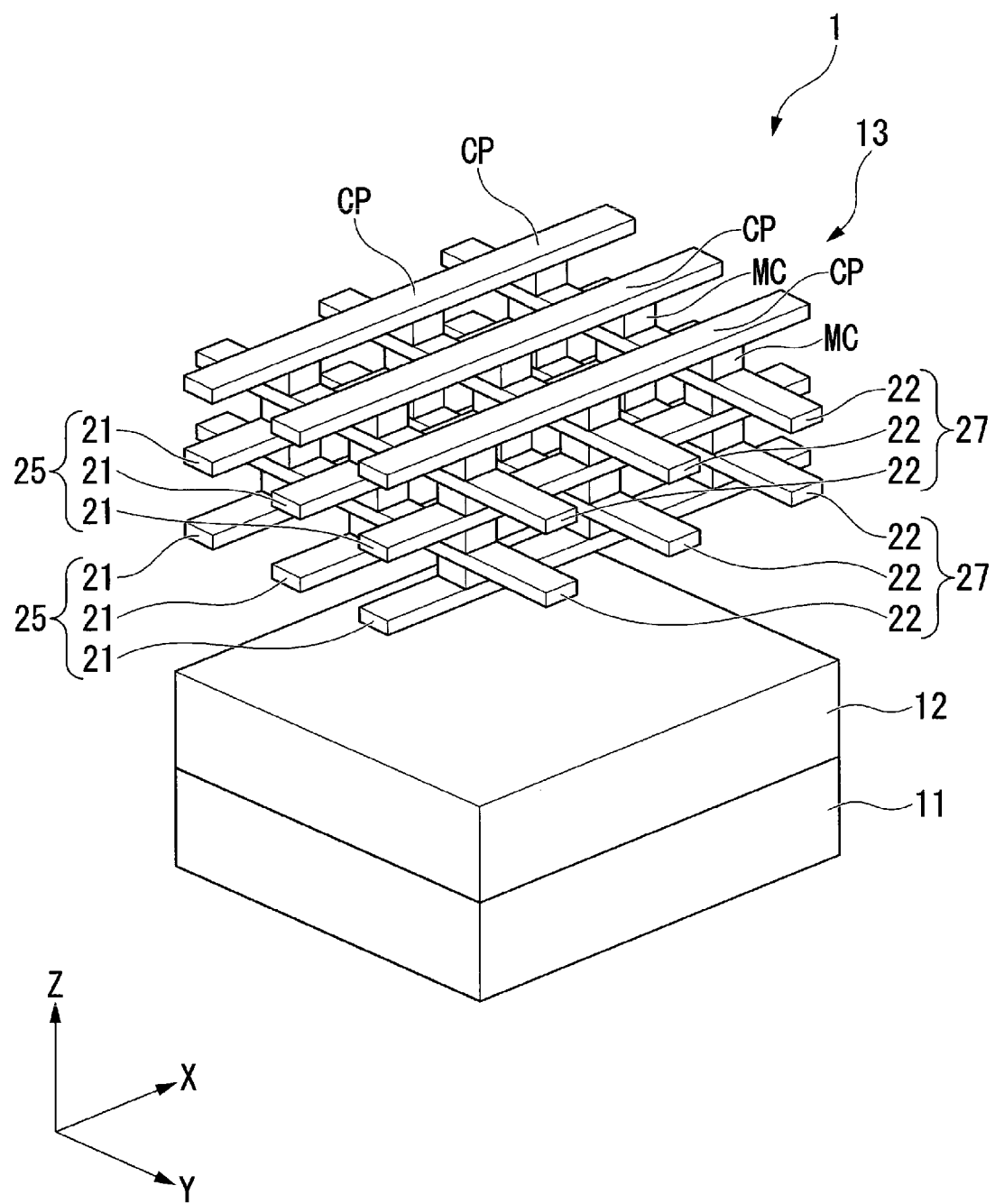
FIG. 1 is a schematic perspective view of a storage device according to at least one embodiment.

It is an object of the present disclosure to provide a storage device which can reduce the load on switching elements.

In general, according to at least one embodiment, a storage device includes a first conductor, a second conductor, a variable resistance layer, a first portion, and a second portion. The variable resistance layer connects with the first conductor or the second conductor. The first portion is provided between the first conductor and the second conductor, and has a first threshold voltage value at which the resistance value changes. The second portion is provided between the first conductor and the first portion and/or between the second conductor and the first portion, and has a second threshold voltage value at which the resistance value changes and which is higher than the first threshold voltage value.

Embodiments of the present disclosure will now be described with reference to the drawings. In the following description, the same symbols are used for components or elements having the same or similar functions, and a duplicate description thereof will sometimes be omitted. The drawings are schematic or conceptual: the relationship between the thickness and the width of a component or element, the size ratio between components or elements, etc. are not necessarily to scale.

As used herein, the term "connection" is not limited to physical connection, and includes electrical connection. Thus, "connection" is not limited to direct connection between two members, and includes the case where another member intervenes between the two members. On the other hand, the term "contact" refers to direct contact. As used herein, the verbs "to overlap" and "to face" are not limited to the case where two members directly face each other, and includes the case where another member intervenes between the two members. Further, "to overlap" and "to face" include the case where part of a member overlaps or faces part of another member. The "thickness" is a term of convenience, and may be interpreted to mean "dimension".

At the outset, X direction, Y direction and Z direction are defined as follows. X direction is a direction approximately parallel to the surface of the below-described silicon substrate 11 and in which the below-described word lines 21 extend (see FIG. 1). Y direction is a direction approximately parallel to the surface of the silicon substrate 11 and intersecting (e.g. approximately perpendicularly) the X direction, and in which the below-described bit lines 22 extend. Z direction is a direction approximately perpendicular to the surface of the silicon substrate 11 and intersecting (e.g. approximately perpendicularly) the X direction and the Y direction. +Z direction is a direction from the silicon substrate 11 toward the below-described storage unit 13 (see FIG. 1). −Z direction is a direction opposite to the +Z direction. When no distinction is made between the +Z direction and the −Z direction, they will be referred to simply as the "Z direction". The "+Z direction" may sometimes be referred to herein as "above" or "upper", and the "−Z direction" as "below" or "lower". It is to be noted, however, that these expressions are just for the sake of convenience, and do not relate to the direction of gravitational force.

FIG. 1 is a schematic perspective view of a storage device 1 according to at least one embodiment.

The storage device 1 is an example of a so-called cross-point type storage device. The storage device 1 includes a silicon substrate 11, an interlayer insulating film 12 and a storage unit 13.

A drive circuit (not shown) for the storage device 1 is formed on the silicon substrate 11.

The interlayer insulating film 12 lies over the silicon substrate 11 and covers the drive circuit. The interlayer insulating film 12 is formed of, for example, silicon oxide (SiO).

The storage unit 13 is provided above the interlayer insulating film 12. The storage unit 13 includes word lines (first conductors, first conductive layers) 21, bit lines (second conductors, second conductive layers) 22 and memory cells MC.

The word lines 21 extend in strips in the X direction. The word lines 21 are arranged at intervals in the Y direction and in the Z direction. Word lines 21, arranged in the Y direction at the same level in the Z direction, constitute a word line layer 25. Thus, in this embodiment, a plurality of word line layers 25 are arranged at intervals in the Z direction. Each word line 21 is formed of, for example, silicon (Si).

The bit lines 22 extend in strips in the Y direction. The bit lines 22 are arranged at intervals in the X direction and in the Z direction. Bit lines 22, arranged in the X direction at the same level in the Z direction, constitute a bit line layer 27. In at least one embodiment, each bit line layer 27 is provided between two word line layers 25, which are located adjacent to each other in the Z direction, at a distance from the respective word line layer 25 in the Z direction. Each bit line 22 is formed of, for example, silicon (Si).

An interlayer insulating film (not shown) is provided between adjacent word lines 21 in each word line layer 25, and an interlayer insulating film (not shown) is provided between adjacent bit lines 22 in each bit line layer 27.

The word lines 21 and the bit lines 22 intersect (e.g. perpendicularly) each other when viewed in the Z direction. When viewed in the Z direction, the memory cells MC are provided between the word lines 21 and the bit lines 22 at cross-points CP between the word lines 21 and the bit lines 22. The memory cells MC, provided at the cross-points CP, are arranged in a three-dimensional matrix pattern at intervals in the X direction, in the Y direction and in the Z direction.

Figure 2:
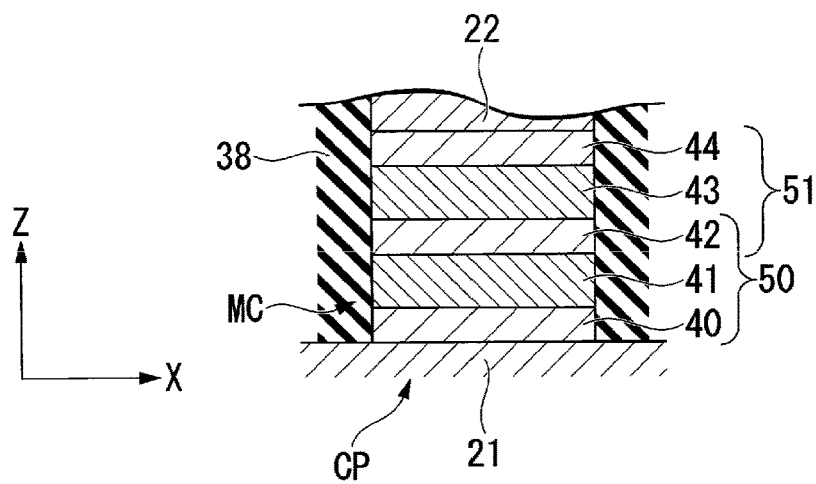
FIG. 2 is a cross-sectional view of a memory cell according to at least one embodiment.

FIG. 2 is a cross-sectional view of a memory cell MC.

As shown in FIG. 2, the memory cell MC has an approximately prismatic shape with the Z direction as the longitudinal direction. The lower end of the memory cell MC is in contact with a word line 21 at a cross-point CP. The upper end of the memory cell MC is in contact with a bit line 22 at a cross-point CP. An interlayer insulating film 38 is provided between memory cells MC which are adjacent to each other in the X direction, and an interlayer insulating film 38 is provided between memory cells MC which are adjacent to each other in the Y direction.

The memory cell MC includes a first electrode 40, a storage layer (variable resistance layer) 41, a second electrode 42, a switching layer 43, and a third electrode 44. The first electrode 40, the storage layer 41, the second electrode 42, the switching layer 43 and the third electrode 44 are stacked in this order in the +Z direction.

The first electrode 40, the storage layer 41 and the second electrode 42 constitute a storage element 50. The storage element 50 performs writing, erasure and reading of information.

The second electrode 42, the switching layer 43 and the third electrode 44 constitute a switching element 51. The switching elements 51 selectively cause a plurality of memory cells MC (storage elements 50) to operate. In the memory cell MC, the storage element 50 and the switching element 51 are connected in series.

The first electrode 40 functions as a lower electrode of the storage element 50. The first electrode 40 is provided on the word line 21 at the above-described cross-point CP. The first electrode 40 is formed of carbon (C), carbon nitride (CN), tungsten (W), titanium nitride (TiN), or the like. A barrier layer (not shown) may be provided between the first electrode 40 and the word line 21.

The storage layer 41 may be appropriately selected, depending on the storage method of the storage element 50, from ReRAM (resistance-variable memory), PCM (phase-change memory, MRAM (magnetoresistance-change memory), etc.

The second electrode 42 functions as an upper electrode of the storage element 50 and as a lower electrode of the switching element 51. The second electrode 42 is provided on the storage layer 41. The second electrode 42 is formed of the same material as that of the first electrode 40.

Figure 3:
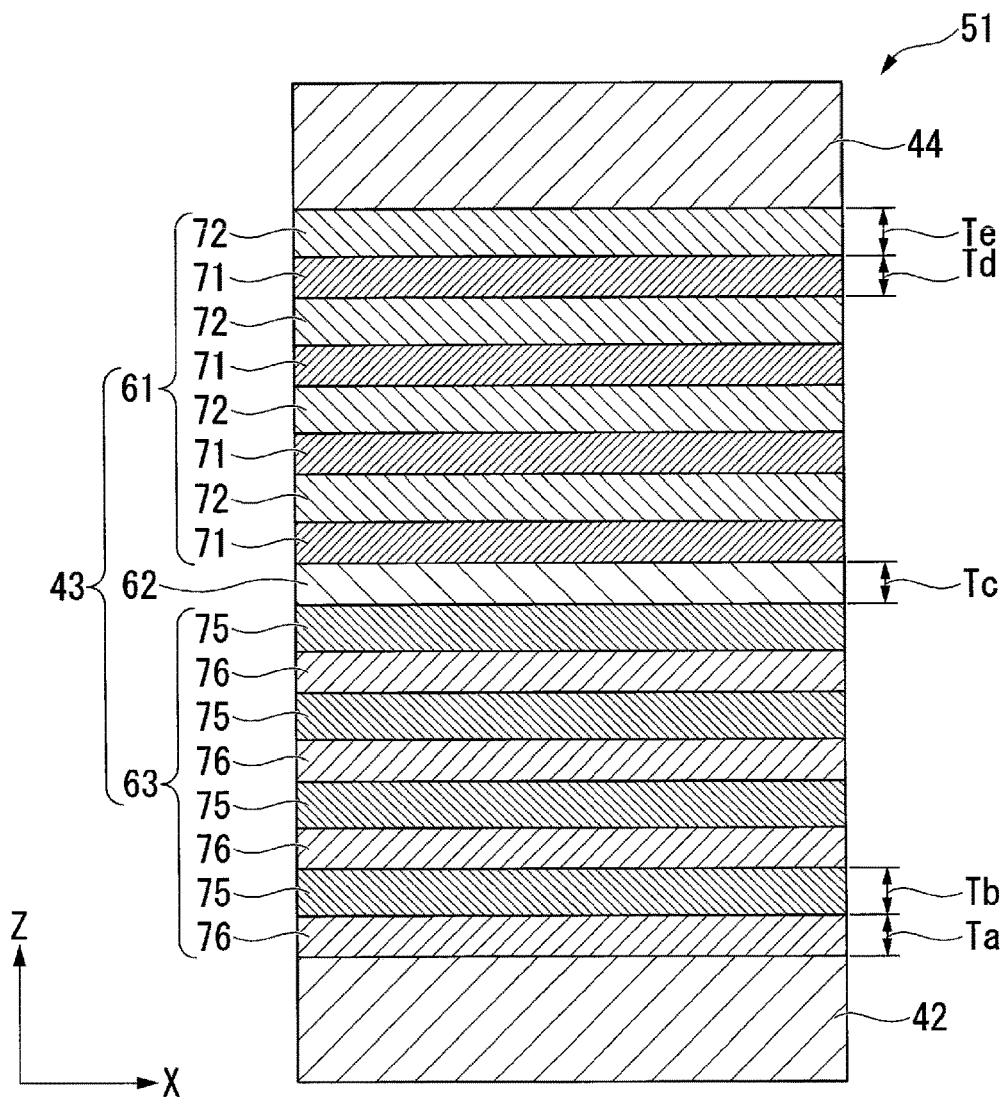
FIG. 3 is a cross-sectional view of a switching element according to at least one embodiment.

FIG. 3 is a cross-sectional view of the switching element 51.

As shown in FIG. 3, the switching layer 43 is a layer whose resistive state changes upon the application of a voltage while remaining an amorphous layer without a phase change. In particular, the switching layer 43 comprises a first switching portion 61, an intermediate barrier layer 62, and a second switching portion 63. The first switching portion 61, the intermediate barrier layer 62 and the second switching portion 63 are stacked in this order in the −Z direction. Thus, the first switching portion 61 is located in the +Z direction with respect to the intermediate barrier layer 62, while the second switching portion 63 is located in the −Z direction with respect to the intermediate barrier layer 62. However, the first switching portion 61 may be located in the −Z direction with respect to the intermediate barrier layer 62, while the second switching portion 63 may be located in the +Z direction with respect to the intermediate barrier layer 62. Further, first switching portions 61 and second switching portions 63 may be provided alternately.

The first switching portion 61 is a stacked film composed of first functional layers 71 and first barrier layers 72 which are stacked alternately.

The second switching portion 63 and the first switching portion 61 are connected in series. The second switching portion 63 is a stacked film composed of second functional layers 75 and second barrier layers 76 which are stacked alternately. The first switching portion 61 is an example of a "first portion", and the second switching portion 63 is an example of a "second portion".

The second switching portion 63 is provided on the second electrode 42. In particular, the second switching portion 63 is composed of the second functional layers 75 and the second barrier layers 76 which are stacked alternately, with one second barrier layer 76 being the lowermost layer and one second functional layer 75 being the topmost layer. Thus, the lowermost second barrier layer 76 is in contact with the second electrode 42. However, it is possible to use a structure in which one second functional layer 75 is in contact with the second electrode 42. The second functional layer(s) 75 is an example of a "third layer(s)", and the second barrier layer(s) 76 is an example of a "fourth layer(s)".

The second barrier layers 76 are preferably made of a material having a higher melting point than those of the first functional layers 71 and the second functional layers 75. In particular, the second barrier layers 76 are composed of a combination of at least one element selected from first barrier elements, such as boron (B), carbon (C), magnesium (Mg), aluminum (Al), silicon (Si), germanium (Ge), etc., with at least one element selected from second barrier elements which are nitrogen (N) and oxygen (O). The second barrier layers 76 of this embodiment are formed of, for example, aluminum nitride (AlN). The first barrier element (s) to be selected for the second barrier layers 76 is an example of a "ninth element(s)", while the second barrier element (s) is an example of a "tenth element(s)".

The thickness Ta of each second barrier layer 76 is preferably uniform. In this embodiment, the thickness Ta of each second barrier layer 76 is about 1 nm.

Each second functional layer 75 is provided on each second barrier layer 76. The second functional layers 75 contain a first switching element selected from chalcogen elements, a second switching element selected from conductive elements, and a third switching element selected from nitrogen (N) and oxygen (O). Thus, the second functional layers 75 are made of a compound (so-called chalcogenide) composed of a chalcogen element as the first switching element to which at least a conductive element as the second switching element, and nitrogen (N) or oxygen (O) as the third switching element are bonded. The first switching element to be selected for the second functional layers 75 is an example of a "third element", the second switching element is an example of a "fourth element", and the third switching element is an example of a "sixth element".

The chalcogen elements as the first switching elements are elements belonging to group 16 of the periodic table, but excluding oxygen (O), for example, sulfur (S), selenium (Se) and tellurium (Te). The second functional layers 75 of this embodiment contain at least one of such chalcogen elements.

Examples of the conductive elements as the second switching elements include boron (B), carbon (C), magnesium (Mg), aluminum (Al), silicon (Si) and germanium (Ge). The second functional layers 75 of this embodiment contain at least one of such conductive elements.

Nitrogen (N) or oxygen (O) as the third switching element increases the resistance of the second functional layers 75. The second functional layers 75 of this embodiment are formed of a compound containing the above-described first to third switching elements, for example, AlSiTeN.

The thickness Tb of each second functional layer 75 is preferably not less than 0.5 nm and not more than 2.0 nm. Poor film formation can be prevented by making the thickness Tb of each second functional layer 75 not less than 0.5 nm. On the other hand, the crystallization temperature can be raised by making the thickness Tb of each second functional layer 75 not more than 2.0 nm. This facilitates control of a phase change upon the application of a voltage.

The intermediate barrier layer 62 separates the first switching portion 61 and the second switching portion 63. The intermediate barrier layer 62 is provided on the topmost second functional layer 75 of the second switching portion 63. The intermediate barrier layer 62 is formed of the same material as the above-described material of the second barrier layers 76. The thickness Tc of the intermediate barrier layer 62 is preferably equal to the thickness Ta of each second barrier layer 76. The intermediate barrier layer 62 is an example of an "intermediate layer" or "third portion".

The first switching portion 61 is provided on the intermediate barrier layer 62. In particular, the first switching portion 61 is composed of the first functional layers 71 and the first barrier layers 72 which are stacked alternately, with one first functional layer 71 being the lowermost layer and one first barrier layer 72 being the topmost layer. Thus, the lowermost first functional layer 71 is in contact with the intermediate barrier layer 62. In at least one embodiment, the thickness of the first switching portion 61 is equal to the thickness of the second switching portion 63. However, the thicknesses of the first switching portion 61 and the second switching portion 63 may be made different by making the thickness of each layer and the number of layers different between the first functional layers 71 and the second functional layers 75. The first functional layer(s) 71 is an example of a "first layer(s)", and the first barrier layer(s) 72 is an example of a "second layer(s)".

In at least one embodiment, the first functional layers 71 are formed of, for example, AlTeN. As with the above-described second functional layers 75, the first functional layers 71 contain a first switching element selected from chalcogen elements, a second switching element selected from conductive elements, and a third switching element selected from nitrogen (N) and oxygen (O). The first switching element to be selected for the first functional layers 71 is an example of a "first element", the second switching element is an example of a "second element", and the third switching element is an example of a "fifth element". As with the above-described second functional layers 75, the thickness Td of each first functional layer 71 is preferably not less than 0.5 nm and not more than 2.0 nm.

Each first barrier layer 72 is provided on each first functional layer 71. The first barrier layers 72 are formed of the same material as the above-described material of the intermediate barrier layer 62 and the second barrier layers 76. The thickness Te of each first barrier layer 72 is preferably equal to the thickness of the intermediate barrier layer 62 or the thickness of each barrier layer 76. The first barrier element(s) to be selected for the first barrier layers 72 is an example of a "seventh element (s)", while the second barrier element(s) is an example of an "eighth element(s)".

The third electrode 44 functions as an upper electrode of the switching element 51. The third electrode 44 is provided on the topmost first barrier layer 72. The third electrode 44 is formed of the same material as those of the first electrode 40 and the second electrode 42.

The first switching portion 61 changes its resistance from a high-resistance state to a low-resistance state by applying thereto a voltage of not less than a predetermined value (first threshold voltage value (first voltage value) Vth1), thereby increasing the electric current flowing through it. The second switching portion 63 changes its resistance from a high-resistance state to a low-resistance state by applying thereto a voltage of not less than a predetermined value (second threshold voltage value (second voltage value) Vth2), thereby increasing the electric current flowing through it.

Figure 4:
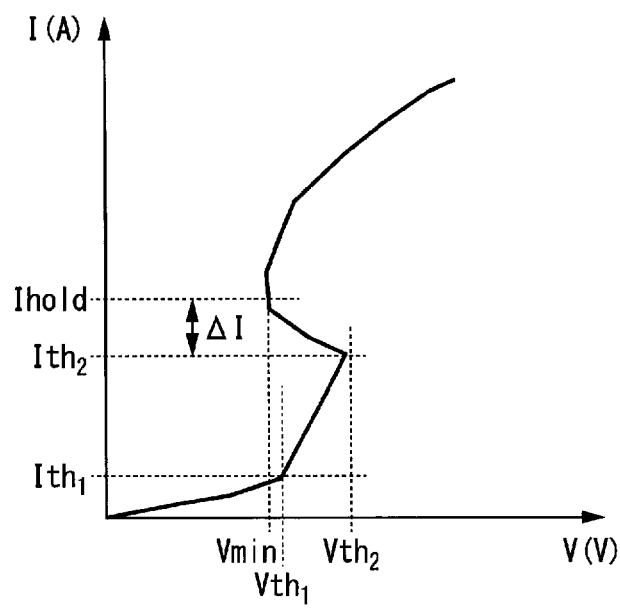
FIG. 4 is a graph showing the current-voltage characteristic of the memory cell according to at least one embodiment.

FIG. 4 is a graph showing the current-voltage characteristic of the memory cell MC of this embodiment. The ordinate axis of FIG. 4 represents current value expressed as the common logarithm.

As shown in FIG. 4, in the switching element 51 of this embodiment, the second threshold voltage value Vth2, at which the second switching portion 63 switches from the high-resistance state (off-state) to the low-resistance state (on-state), is higher than the first threshold voltage value Vth1 at which the first switching portion 61 switches from the off-state to the on-state. Thus, in the switching element 51, both the first switching portion 61 and the second switching portion 63 are in the off-state when the applied voltage is less than the first threshold voltage value Vth1. In the switching element 51, the first switching portion 61 is in the on-state and the second switching portion 63 is in the off-state when the applied voltage is not less than the first threshold voltage value Vth1 and less than the second threshold voltage value Vth2. In the switching element 51, both the first switching portion 61 and the second switching portion 63 are in the on-state when the applied voltage is not less than the second threshold voltage value Vth2. Accordingly, the resistance value of the switching element 51 (the combined resistance of the first switching portion 61 and the second switching portion 63) is highest when the applied voltage is less than the first threshold voltage value Vth1, and lowest when the applied voltage is not less than the second threshold voltage value Vth2. In this embodiment, the first threshold voltage value Vth1 is closer to the second threshold voltage value Vth2 than the mean value between a zero value and the second threshold voltage value Vth2 (Vth1>Vth2/2).

In other words, when the voltage applied to the memory cell MC is less than the first threshold voltage value Vth1 (when the switching portions 61 and 63 are both in the off-state), the switching element 51 has a first resistance change tendency (resistance value per unit voltage (first inclination)). When the voltage applied to the memory cell MC is not less than the first threshold voltage value Vth1 and less than the second threshold voltage value Vth2, the switching element 51 has a second resistance change tendency (second inclination) in which the change in resistance value per unit voltage is larger than that in the first resistance change tendency. When the voltage applied to the memory cell MC is not less than the second threshold voltage value Vth2, the switching element 51 has a third resistance change tendency (third inclination) including a region where the resistance value is lower than that at the second threshold voltage value Vth2.

The first threshold voltage value Vth1 and the second threshold voltage value Vth2 can be appropriately adjusted e.g. by changing the thicknesses of the switching portions 61 and 63. Thus, the threshold voltage values Vth1, Vth2 can be increased by increasing the thicknesses of the switching portions 61 and 63.

A brief description will now be given of a method for producing the above-described memory cells MC. First, a stacked storage element 50 and a stacked switching element 51 are sequentially stacked on each word line 21. Thereafter, the resulting stack is subjected to etching using a mask (not shown) formed on the stacked switching element 51 (third electrode 44), thereby removing those portions (portions other than memory cell MC-forming areas) of the stack of the stacked storage element 50 and the stacked switching element 51 which are not covered with the mask. In this manner, a number of memory cells MC, arranged at intervals in the X direction and in the Y direction, are formed at one time. The formation of a films of each layer can be performed e.g. by sputtering.

The storage operation of the above-described storage device 1 will now be described.

The storage device 1 of at least one embodiment performs writing, erasure and reading of information in the storage elements 50 by applying a voltage to memory cells MC to be operated. In the storage device 1 of this embodiment, an operating voltage V is applied to memory cells MC to be operated (hereinafter referred to as operating cells), while 0 V or V/2 is applied to the other memory cells MC (hereinafter referred to as non-operating cells). The operating voltage V is not less than the second threshold voltage value Vth2.

In each of the memory cells MC of at least one embodiment, the storage element 50 and the switching element 51 are connected in series. Therefore, when the resistance value of the switching element 51 is higher than the resistance value of the storage element 50 (in the case of the first resistance change tendency or the second resistance change tendency), the combined resistance of the operating cell is high, so that a low electric current flows through the operating cell. Thus, the electric current flowing through each operating cell is reduced.

As shown in FIG. 4, when the voltage applied to an operating cell is less than the first threshold voltage value Vth1, both the switching portions 61 and 63 are in the off-state. In this case, the electric current flowing through the switching element 51 is determined by the applied voltage and the first resistance change tendency. In particular, the electric current increases as the applied voltage gradually increases from 0 V. Thus, when the electric current flowing through the memory cell MC lies in the range of less than the first threshold voltage value Vth1, the voltage increases with increase in the electric current based on the first resistance change tendency. When the voltage reaches the first threshold voltage value Vth1, the electric current flowing through the memory cell MC increases to a first threshold current value Ith1.

When the voltage applied to the operating cell reaches the first threshold voltage value Vth1, only the first switching portion 61 turns to the on-state. In this case, the electric current flowing through the switching element 51 is determined by the applied voltage and the second resistance change tendency. In particular, the electric current increases as the applied voltage gradually increases from the first threshold voltage value Vth1. Thus, when the electric current flowing through the memory cell MC lies in the range of more than the first threshold voltage value Vth1 and less than the second threshold voltage value Vth2, the voltage increases with increase in the electric current based on the second resistance change tendency. When the voltage reaches the second threshold voltage value Vth2 which is higher than the first threshold voltage value Vth1, the electric current flowing through the memory cell MC increases to a second threshold current value Ith2.

When the voltage applied to the operating cell reaches the second threshold voltage value Vth2, the first switching portion 61 and the second switching portion 63 turn to the on-state. When the first switching portion 61 and the second switching portion 63 are in the on-state, the resistance value of the switching element 51 is lower than the resistance value of the storage element 50 (third resistance change tendency). Thus, the combined resistance of the operating cell decreases, and the electric current flowing through the operating cell increases.

In the switching element 51 of at least one embodiment, the voltage applied to the switching element 51 decreases after the voltage becomes not less than the second threshold voltage value Vth2 (third resistance change tendency: negative resistance). Further, the electric current flowing through the switching element 51 increases with decrease in the voltage applied to the switching element 51. Thus, the third resistance change tendency is set such that the voltage decreases after the application of the second threshold voltage value Vth2 and, when the voltage applied to the switching element 51 becomes a minimum voltage value Vmin which is lower than the first threshold voltage value Vth1, the electric current flowing through the switching element 51 stabilizes at a holding current value (third current value) Ihold which is higher than the second threshold current value Ith2. The holding current value Ihold herein refers to an electric current at an inflection point where the voltage, which has decreased due to the negative resistance, begins to rise again. In at least one embodiment, the minimum voltage value Vmin is not more than the first threshold voltage value Vth1. Further, in at least one embodiment, the difference between the first threshold voltage value Vth1 and the second threshold voltage value Vth2 is larger than the difference between the first threshold voltage value Vth1 and the minimum voltage value Vmin.

In the storage device 1 having the switching elements 51, the ratio (on/off ratio) of the value of an electric current that flows when the voltage applied to a storage element 50 is not less than the operating voltage V (the switching element 51 is in the on-state) to the value of an electric current that flows when the voltage applied to the storage element 50 is less than the operating voltage V (the switching element 51 is in the off-state) can be made high as in at least one embodiment.

However, a high on/off ratio produces a large difference (current increase ΔI) between a current value (threshold current value) at the moment when a switching element turns to the on-state and the holding current value Ihold. Therefore, it is possible that after the switching element turns to the on-state, an excessive electric current may flow instantaneously due to the negative resistance of the switching element.

In view of this, according to at least one embodiment, each switching element 51 includes the first switching portion 61 which switches from the high-resistance state to the low-resistance state at the first threshold voltage value Vth1, and the second switching portion 63 which switches from the high-resistance state to the low-resistance state at the second threshold voltage value Vth2 which is higher than the first threshold voltage value Vth1.

According to this feature, after the switching element 51 turns to the on-state, the current increase ΔI to the holding current value Ihold can be reduced. In particular, in the course of turning the switching element 51 to the on-state, only the first switching portion 61 first turns to the on-state when the voltage applied to the switching element 51 reaches the first threshold voltage value Vth1. As a result, the resistance of the switching element 51 decreases compared to when the switching portions 61 and 63 are both in the off-state, and therefore the electric current flowing through the memory cell MC increases to the first threshold current value Ith1. Thereafter, when the voltage applied to the switching element 51 reaches the second threshold voltage value Vth2, the second switching portion 63 also turns to the on-state. As a result, the resistance of the switching element 51 decreases compared to when only the first switching portion 61 is in the on-state, and therefore the electric current flowing through the memory cell MC increases to the second threshold current value Ith1.

A threshold current value is herein a value, expressed as the common logarithm, indicating the magnitude of an electric current at a predetermined voltage. Thus, the first threshold current value Ith1 is a value (first value), expressed as the common logarithm, indicating the magnitude of an electric current at the first threshold voltage value Vth1. The second threshold current value Ith2 is a value (second value), expressed as the common logarithm, indicating the magnitude of an electric current at the second threshold voltage value Vth2. The holding current value Ihold is a value (third value), expressed as the common logarithm, indicating the magnitude of an electric current at the minimum voltage value Vmin in the third resistance change tendency. In at least one embodiment, the difference between the first threshold current value Ith1 and the second threshold current value Ith2 is larger than the difference between the second threshold current value Ith2 and the holding current value Ihold.

In at least one embodiment, the second resistance change tendency preferably satisfies the following two expressions:

$$Vth2 - Vth1 \geq 1 \ (V) \qquad (1)$$

$$Ith2/Ith1 \geq 10 \qquad (2)$$

As will be appreciated from the foregoing, the provision of the switching portions 61 and 63 having the different threshold voltage values makes it possible to increase the electric current to the holding current value Ihold in a stepwise manner. This makes it possible to prevent a rapid increase in the electric current flowing through the memory cell MC while ensuring a sufficient on/off ratio, thereby reducing the load on the memory cell MC.

In at least one embodiment, the first functional layers 71 and the second functional layers 75 contain a first switching element comprising a chalcogen element, and a second switching element comprising a conductive element.

In such functional layers 71 and 75, there exist the elements having different atomic radii: the chalcogen element having a relatively large atomic radius; and the second switching element having a relatively small atomic radius. This stabilizes the amorphous structure of the functional layers 71 and 75.

In at least one embodiment, the intermediate barrier layer 62 is provided between the first functional layer 71 and the second functional layer 75.

This can prevent diffusion between the first functional layer 71 and the second functional layer 75, thereby preventing the formation of a leak path between the first functional layer 71 and the second functional layer 75. Accordingly, it becomes possible to reduce leakage current in the off-state, and to allow the first functional layer 71 and the second functional layer 75 to perform their switching function over a long period of time.

In at least one embodiment, the first switching portion 61 is composed of the first functional layers 71 and the first barrier layers 72 which are stacked alternately, and the second switching portion 63 is composed of the second functional layers 75 and the second barrier layers 76 which are stacked alternately.

This can prevent diffusion between adjacent first functional layers 71 and between adjacent second functional layers 75, thereby preventing the formation of a leak path between adjacent first functional layers 71 and between adjacent second functional layers 75. Accordingly, it becomes possible to reduce leakage current in the off-state, and to allow the first functional layers 71 and the second functional layers 75 to perform their switching function over a long period of time.

Furthermore, the stacking of the plurality of barrier layers 72 and the plurality of barrier layers 76 can reduce the voltage applied to each barrier layer 72 and each barrier layer 76, thereby preventing the respective layers 72 and 76 from reaching a breakdown voltage.

In at least one embodiment, the second switching element, constituting part of the functional layers 71 and 75, is the same as the first barrier element constituting part of the barrier layers 65, 72, and 76.

Should the first barrier element diffuse into a functional layer 71 and 75, it does not exist as an impurity in the functional layer 71 and 75. This allows the first functional layer 71 and the second functional layer 75 to perform their switching function over a long period of time.

Figure 5:
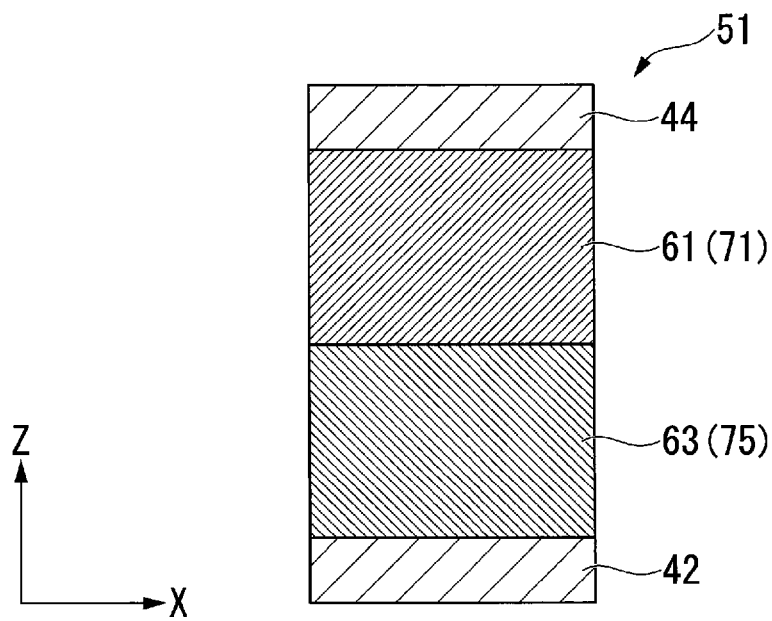
FIG. 5 is a cross-sectional view of a variation of the switching element according to at least one embodiment.

In the above-described embodiment, the intermediate barrier layer 62 is provided between the first switching portion 61 and the second switching portion 63; however, the present disclosure is not limited to this feature. For example, as in the switching element 51 shown in FIG. 5, the first switching portion 61 (first functional layer 71) may be in contact with the second switching portion 63 (second functional layer 75). In the above-described embodiment, the first switching portion 61 is a stacked film composed of the first functional layers 71 and the first barrier layers 72, and the second switching portion 63 is a stacked film composed of the second functional layers 75 and the second barrier layers 76; however, the present disclosure is not limited to this feature. For example, the switching element 51 may be a stacked film composed of a single first functional layer 71 and a single second functional layer 75.

According to at least one of the embodiments described above, a storage device includes a first conductor, a second conductor, a first portion, and a second portion. The second conductor is disposed opposite the first conductor. The first portion is provided between the first conductor and the second conductor, and switches from a high-resistance state to a low-resistance state at a first threshold voltage value. The second portion is provided between the first conductor and the first portion and/or between the second conductor and the first portion, and switches from a high-resistance state to a low-resistance state at a second threshold voltage value which is higher than the first threshold voltage value. The thus-constructed storage device can reduce the load on switching elements while ensuring a sufficient on/off ratio.

A description will now be given of some exemplary storage devices.

A storage device comprising: a first conductor; a second conductor; a first portion which is provided between the first conductor and the second conductor, and which switches from a high-resistance state to a low-resistance state at a first threshold voltage; and a second portion which is provided between the first conductor and the first portion and/or between the second conductor and the first portion, and which switches from a high-resistance state to a low-resistance state upon the application of a second threshold voltage which is higher than the first threshold voltage.

[2] A storage device as described in [1] above, wherein the first portion contains a first element selected from at least one of chalcogen elements which are tellurium, selenium and sulfur, and a second element selected from at least one of conductive elements which are boron, carbon, magnesium, aluminum, silicon and germanium, and wherein the second portion contains a third element selected from at least one of chalcogen elements which are tellurium, selenium and sulfur, and a fourth element selected from at least one of conductive elements which are boron, carbon, magnesium, aluminum, silicon and germanium.

[3] A storage device as described in [2] above, wherein the third element is the same element as the first element, and the fourth element is the same element as the second element.

[4] A storage device as described in [2] above, wherein the second element is selected from at least one of conductive elements which are boron, carbon, magnesium, silicon and germanium, and the fourth element is selected from at least one of conductive elements which are boron, carbon, magnesium, silicon and germanium.

[5] A storage device as described in [2] above, wherein the first portion contains a fifth element selected from at least one of nitrogen and oxygen, and the second portion contains a sixth element selected from at least one of nitrogen and oxygen.

[6] A storage device as described in [5] above, wherein the sixth element is the same element as the fifth element.

[7] A storage device as described in [1] above, further comprising an intermediate layer provided between the first portion and the second portion.

[8] A storage device as described in [1] above, wherein the first portion comprises a plurality of first layers and a plurality of second layers which are stacked alternately, each of the first layers changing between a high-resistance state and a low-resistance state depending on an applied voltage, and wherein the second portion comprises a plurality of third layers and a plurality of fourth layers which are stacked alternately, each of the third layers changing between a high-resistance state and a low-resistance state depending on an applied voltage.

[9] A storage device as described in [8] above, wherein each of the first layers contains a first element selected from at least one of chalcogen elements which are tellurium, selenium and sulfur, and a second element selected from at least one of conductive elements which are boron, carbon, magnesium, aluminum, silicon and germanium, and wherein each of the third layers contains a third element selected from at least one of chalcogen elements which are tellurium, selenium and sulfur, and a fourth element selected from at least one of conductive elements which are boron, carbon, magnesium, aluminum, silicon and germanium.

[10] A storage device as described in [9] above, wherein each of the first layers contains a fifth element selected from at least one of nitrogen and oxygen, and each of the third layers contains a sixth element selected from at least one of nitrogen and oxygen.

[11] A storage device as described in [9] above, wherein each of the second layers contains a seventh element selected from at least one of conductive elements which are boron, carbon, magnesium, aluminum, silicon and germanium, and an eighth element selected from at least one of nitrogen and oxygen, and wherein each of the fourth layers contains a ninth element selected from at least one of conductive elements which are boron, carbon, magnesium, aluminum, silicon and germanium, and an tenth element selected from at least one of nitrogen and oxygen.

[12] A storage device as described in [11] above, wherein the ninth element is the same element as the seventh element, and the tenth element is the same element as the eighth element.

[13] A storage device as described in [11] above, wherein the second element, the fourth element, the seventh element and the ninth element are the same.

[14] A storage device as described in [11] above, wherein the fifth element, the sixth element, the eighth element and the tenth element are the same.

[15] A storage device as described in [8] above, wherein the thickness of each first layer is not less than 0.5 nm and not more than 2.0 nm, and the thickness of each third layer is not less than 0.5 nm and not more than 2.0 nm.

[16] A storage device comprising: a first conductor; a second conductor; and a switching element which is provided between the first conductor and the second conductor, and which has a first resistance change tendency when a voltage, applied between the first conductor and the second conductor, is less than a first threshold voltage value, has a second resistance change tendency, in which the change in resistance value per unit voltage is larger than that in the first resistance change tendency, when the applied voltage is not less than the first threshold voltage value and less than a second threshold voltage value, and has a third resistance change tendency, including a region where the resistance value is lower than that at the second threshold voltage value, when the applied voltage is not less than the second threshold voltage value, wherein the first threshold voltage value is closer to the second threshold voltage value than to a zero value.

[17] A storage device as described in [16] above, wherein the first threshold voltage value is closer to the second threshold voltage value than the mean value between a zero value and the second threshold voltage value.

[18] A storage device as described in [16] above, wherein the first threshold voltage value is higher than a minimum voltage value in the third resistance change tendency.

[19] A storage device as described in [16] above, wherein the difference between a first value, expressed as the common logarithm, indicating the magnitude of an electric current at the first threshold voltage value and a second value, expressed as the common logarithm, indicating the magnitude of an electric current at the second threshold voltage value is larger than the difference between the second value and a third value, expressed as the common logarithm, indicating the magnitude of an electric current at a minimum voltage value in the third resistance change tendency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a first conductor;
a second conductor;
a variable resistance layer connecting with the first conductor or the second conductor;
a first portion provided between the first conductor and the second conductor, and having a first threshold voltage value at which the resistance value of the first portion changes, the first portion including a plurality of first layers and a plurality of second layers which are stacked alternately; and
a second portion provided between the first conductor and the first portion and/or between the second conductor and the first portion, and having a second threshold voltage value at which the resistance value of the second portion changes, the second threshold voltage value being higher than the first threshold voltage value, the second portion including a plurality of third layers and a plurality of fourth layers which are stacked alternately.

2. The storage device according to claim 1, wherein the first portion contains a first element comprising at least one chalcogen element selected from tellurium, selenium or sulfur, and a second element comprising at least one conductive element selected from boron, carbon, magnesium, aluminum, silicon or germanium, and wherein the second portion contains a third element comprising at least one chalcogen element selected from tellurium, selenium or sulfur, and a fourth element comprising at least one conductive element selected from boron, carbon, magnesium, aluminum, silicon or germanium.

3. The storage device according to claim 2, further comprising an intermediate layer provided between the first portion and the second portion.

4. The storage device according to claim 2,
wherein each of the first layers has a resistance value between a high value and a low value lower than the high value, depending on an applied voltage, and
wherein each of the third layers has a resistance value between another high value and a low value lower than the high value, depending on an applied voltage.

5. The storage device according to claim 1, further comprising an intermediate layer provided between the first portion and the second portion.

6. The storage device according to claim 1,
wherein each of first layers has a resistance value between a high value and a low value lower than the high value, depending on an applied voltage, and
wherein each of the third layers has a resistance value between another high value and another low value lower than the another high value, depending on an applied voltage.

7. A storage device according to claim 1, wherein the plurality of first layers are AlTeN, the plurality of second layers are AlN, and the plurality of third layers are AlSiTeN.

8. A storage device comprising:
a first conductor;
a second conductor; and
a switching element which is provided between the first conductor and the second conductor, the switching element having a first resistance change tendency when a voltage, applied between the first conductor and the second conductor, is less than a first threshold voltage value, the switching element having a second resistance change tendency, in which a change in resistance value per unit voltage is larger than that in the first resistance change tendency, when the applied voltage is not less than the first threshold voltage value and is less than a second threshold voltage value, and the switching element having a third resistance change tendency, including a region where a resistance value is lower than that at the second threshold voltage value, when the applied voltage is not less than the second threshold voltage value, wherein the first resistance change tendency, the second resistance tendency and the third resistance change tendency are continuous.

9. The storage device according to claim 8, wherein the first threshold voltage value is closer to the second threshold voltage value than to a zero voltage value.

10. The storage device according to claim 9, wherein the first threshold voltage value is closer to the second threshold voltage value than a mean voltage value of a zero voltage value and the second threshold voltage value.

11. The storage device according to claim 9, wherein the first threshold voltage value is higher than a minimum voltage value in the third resistance change tendency.

12. The storage device according to claim 9, wherein a difference between a first current value, expressed as a common logarithm, indicating a magnitude of an electric current flowing through the switching element at the first threshold voltage value, and a second current value, expressed as the common logarithm, indicating a magnitude of an electric current flowing through the switching element at the second threshold voltage value, is larger than a difference between the second current value and a third current value, expressed as the common logarithm, indicating a magnitude of an electric current flowing through the switching element at a minimum voltage value in the third resistance change tendency.

13. A storage device comprising:
a first conductive layer;
a second conductive layer;
a variable resistance layer connecting with the first conductive layer or the second conductive layer;
a first portion provided between the first conductive layer and the second conductive layer, the first portion including a plurality of first layers and a plurality of a second layers which are stacked alternately, the first layers including a first element comprising at least one chalcogen element selected from tellurium, selenium or sulfur, and a second element comprising at least one conductive element selected from boron, carbon, magnesium, aluminum, silicon or germanium, and containing a nitride; and
a second portion provided between the first conductive layer and the first portion, the second portion including a plurality of third layers and a plurality of a fourth layers which are stacked alternately, the third layers including a first element comprising at least one chalcogen element selected from tellurium, selenium or sulfur, and a second element comprising at least one conductive element selected from boron, carbon, magnesium, aluminum, silicon or germanium, and containing a nitride and silicon.

14. The storage device according to claim 13, further comprising a third portion provided between the first portion and the second portion, and containing a nitride of at least one conductive element selected from boron, carbon, magnesium, aluminum, silicon or germanium.

15. The storage device according to claim 13, wherein the first portion is composed of AlTeN, and the second portion is composed of AlSiTeN.

16. The storage device according to claim 13, wherein an electric current increases when a voltage, applied between the first conductive layer and the second conductive layer, is increased from 0 V, and reaches a first current value when the applied voltage reaches a first threshold voltage value; the electric current increases when the applied voltage is increased from the first threshold voltage value, and reaches a second current value, which is higher than the first current value, when the applied voltage reaches a second threshold voltage value which is higher than the first threshold voltage value; and the applied voltage decreases after the application of the second threshold voltage value and, when the applied voltage reaches a third threshold voltage value which is lower than the first threshold voltage value, the electric current reaches a third current value which is higher than the second current value.

17. The storage device according to claim 16, wherein in a graph showing a current-voltage characteristic of the storage device, the electric current increases with a first inclination until the applied voltage reaches the first threshold voltage value, and increases with a second inclination, which is steeper than the first inclination, when the applied voltage increases from the first threshold voltage value to the second threshold voltage value.

18. The storage device according to claim 13, wherein
when an electric current flowing between the first conductive layer and the second conductive layer lies in a range of less than a first current value, the voltage increases with a first inclination with increase in the electric current,
when the electric current lies in a range of more than the first current value and less than a second current value, the voltage increases with a second inclination, which is steeper than the first inclination, with increase in the electric current, and
when the electric current lies in a range of more than the second current value and less than a third current value, the voltage decreases with increase in the electric current.

19. The storage device according to claim 18, wherein a difference between the third current value and the second current value is smaller than a difference between the second current value and the first current value.

20. The storage device according to claim 18, wherein the storage device has a first voltage value, a second voltage value and a third voltage value when the first current value, the second current value and the third current value are reached, respectively, and wherein the second voltage value is higher than the first voltage value, and the third voltage value is lower than the first voltage value.

21. The storage device according to claim 20, wherein a difference between the first voltage value and the second voltage value is larger than a difference between the first voltage value and the third voltage value.

22. A storage device according to claim 13, wherein the plurality of first layers are AlTeN, the plurality of second layers are AlN, and the plurality of third layers are AlSiTeN.

* * * * *